United States Patent [19]

Tremaine

[11] 4,290,014

[45] Sep. 15, 1981

[54] ANALOG/DIGITAL SYSTEM FOR EVALUATING BATTERY CHARACTERISTICS

[75] Inventor: Richard E. Tremaine, Clayton, Calif.

[73] Assignee: The United States of America as represented by the Secretary of the Navy, Washington, D.C.

[21] Appl. No.: 939,000

[22] Filed: Sep. 1, 1978

[51] Int. Cl.$^3$ .................... G01R 13/02; G01R 13/04; G01R 23/16; G01R 31/36
[52] U.S. Cl. .................. 324/77 A; 324/102; 324/112; 324/434; 360/6
[58] Field of Search ............... 324/77 R, 77 A, 77 B, 324/72, 78 D, 78 E, 112, 113, 426, 434, 102, 103; 360/6; 340/347 M; 346/14 R, 14 MR, 17

[56] References Cited

U.S. PATENT DOCUMENTS

| | | | |
|---|---|---|---|
| 3,452,278 | 6/1969 | Myers et al. | 324/77 A |
| 3,548,305 | 12/1970 | Kaufman | 324/77 R |
| 3,889,659 | 6/1975 | Lutes | 346/14 R X |
| 3,924,182 | 12/1975 | Jensen | 324/77 R |
| 4,006,410 | 2/1977 | Roberts | 324/72 |
| 4,086,805 | 5/1978 | Kinderling et al. | 324/102 X |
| 4,157,571 | 6/1979 | Shu | 360/6 X |

FOREIGN PATENT DOCUMENTS 172534 12/1963 U.S.S.R. ............................ 324/77 A

OTHER PUBLICATIONS

Kajihara, H. H., *Power Transient Monitor*, IEEE Transactions on Instr. and Meas. Feb. 1972 pp. 74–77.

*Primary Examiner*—Gerard R. Strecker
*Attorney, Agent, or Firm*—R. S. Sciascia; Charles D. B. Curry; George L. Craig

[57] ABSTRACT

In a system for quality control evaluation of energized electrical power sources, a waveform analysis apparatus and method is employed permitting greatly increased capability for the detection, measurement and evaluation of the signal characteristics, especially the noise signal, of the tested units. A high-speed magnetic tape recorder stores the output signal of the unit under test. A high-speed AC-to-DC converter receives the output noise signal and inputs it to a fast-responding, track-and-hold peak detector. The peak level output signal of the peak detector may be displayed for any desired time interval and the peak detector reset resulting in discrete time interval printouts of peak noise output. Noise levels of interest may be rapidly located and a complete display of the power source output signals during that time interval of interest obtained from the magnetic tape recorder allowing detailed waveform analysis.

6 Claims, 5 Drawing Figures

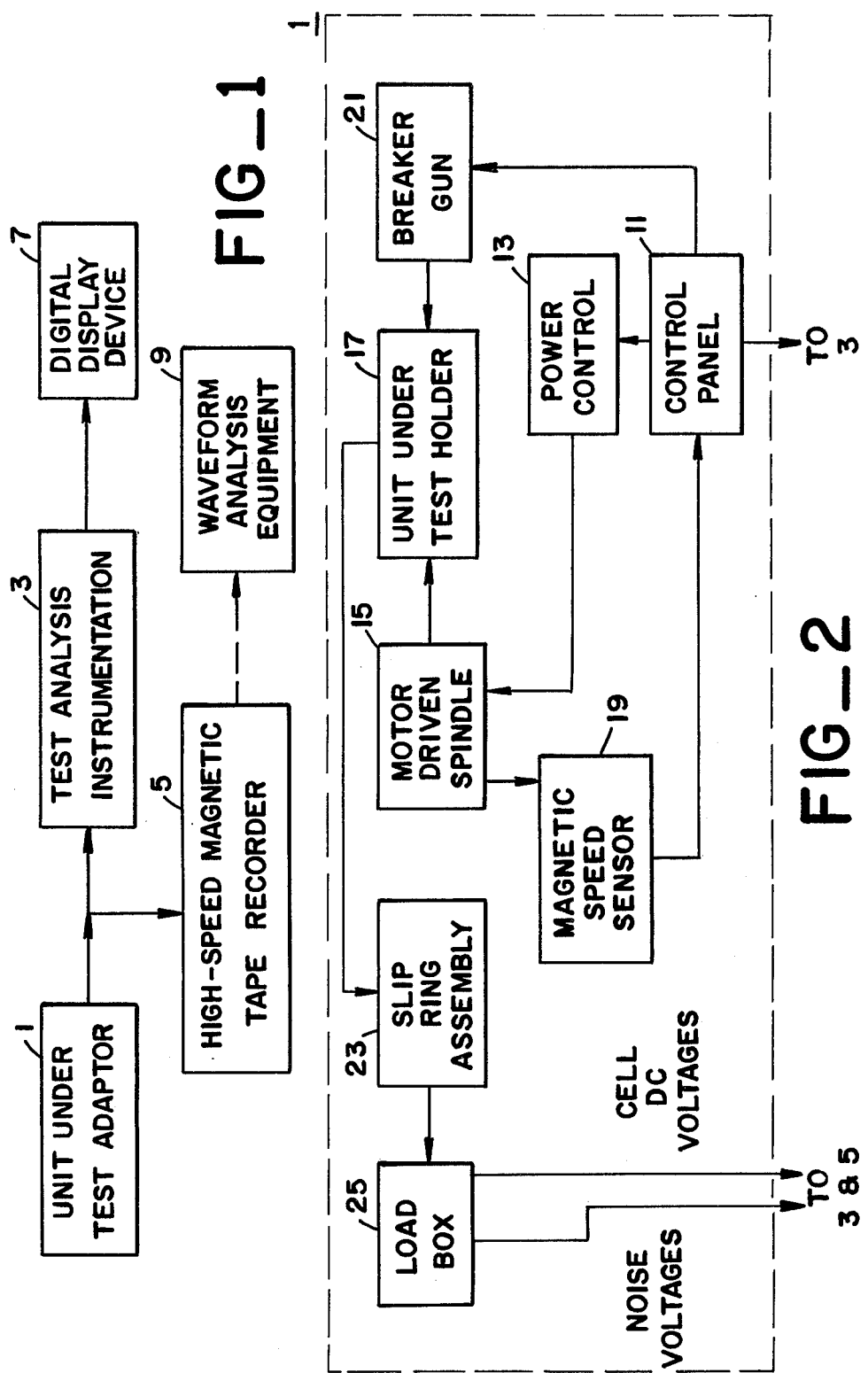

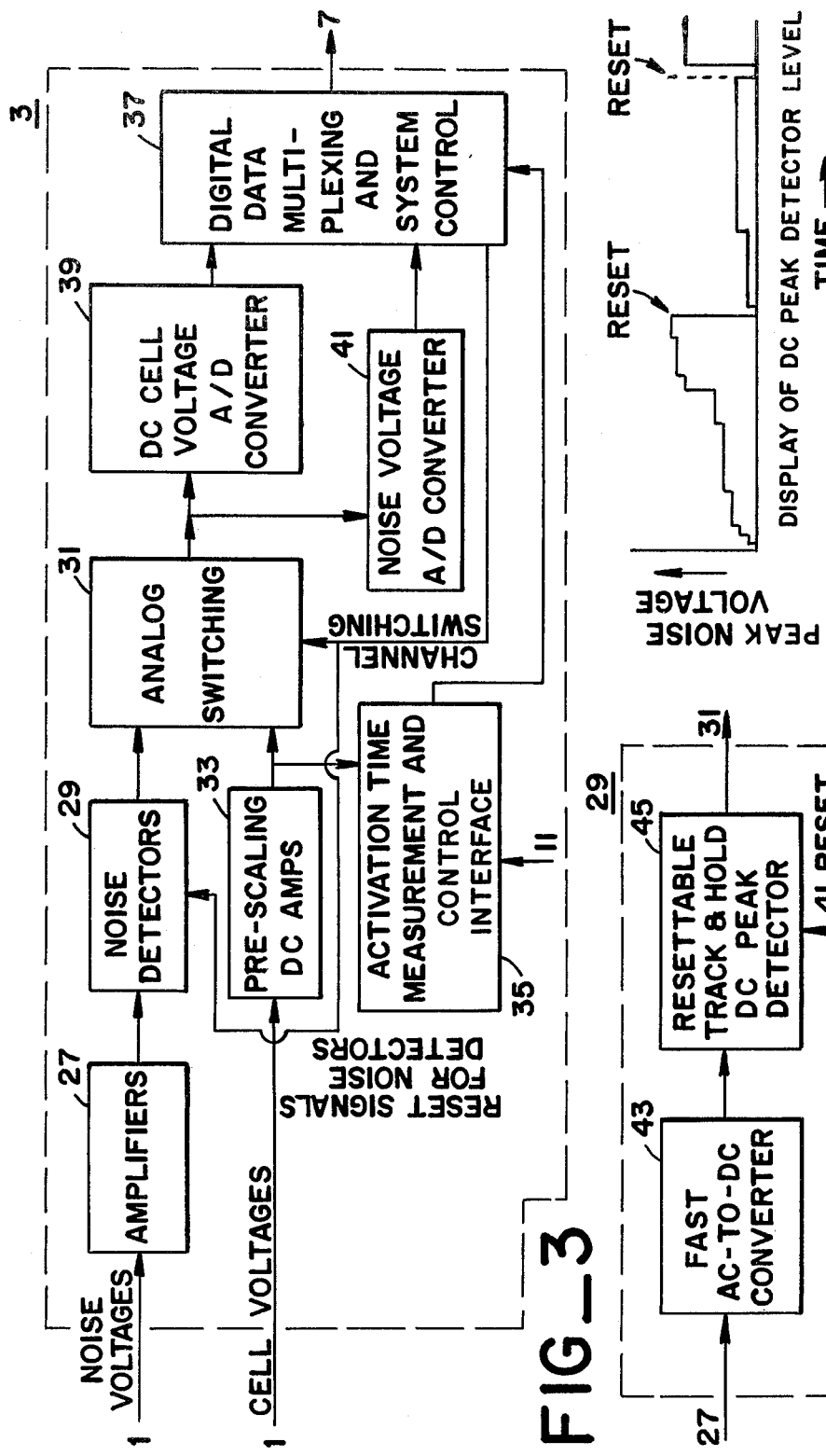

ANALOG/DIGITAL SYSTEM FOR EVALUATING BATTERY CHARACTERISTICS

BACKGROUND OF THE INVENTION

1. Field of the Invention

This invention relates generally to a unique apparatus and method of evaluating the electrical characteristics of an energized electrical power source.

More specifically, the invention relates to an apparatus and method for evaluating output noise signals on reserve energizes used in gun ammunition fuels.

In particular, the invention relates to a relatively inexpensive apparatus and method for performing detailed non-real-time waveform analysis of selected signal portions of an energized electrical power source.

2. Description of Prior Art

The art of testing energized electrical power sources, especially batteries, is well-known. The characteristics of interest during testing are usually activation time, life time and noise output of each electrical energy cell tested. Conventional testing methods fall into two categories: testing where events of interest occur frequently and warrant expensive real-time analysis and testing where events of interest occur sporadically and real-time analysis is unnecessary or prohibitively expensive. The instant invention relates to the latter category where events of interest occur only infrequently and sporadically but detailed analysis capability is desired for each event occurring.

Conventional testing technique is to connect the output of each cell under test to a recording device, usually a strip chart recorder, and analyze the subsequent trace(s) for each cell recorded. Although generally adequate for measuring characteristics such as activation time and lifetime, this technique exhibits severe limitations in the measurement of cell noise. Waveform analysis upon cell noise signals having frequency greater than a few hundred Hertz is barely possible if at all for two major reasons.

First, the damping effects of the galvanometers used in conventional strip chart recorders prevent a true trace of the amplitude of the noise voltage and this problem grows worse with increasing frequency of the noise signal. Some special light beam recording oscillographs employing a fiber optic CRT avoid the damping effect problem but they constitute a minority of all such recording devices.

An even greater limitation, not avoided by the conventional real-time method or apparatus, is the inability to provide a representation of the noise signal waveform. For example, to display a 5 KHZ noise signal such that variations having period less than 0.05 seconds could be discerned would require strip chart speeds of 20 meters/second. Where the evaluation period covered 30 seconds or more, the data would become wholly unmanageable. The instant invention allows pinpointing of the sporadically occurring event of interest in time and display of only that time period containing that event. Thus, detailed waveform analysis of isolated events is both feasible and practical as it is not by any other technique.

SUMMARY OF THE INVENTION

The invention is briefly summarized as an apparatus and method for the testing and evaluation of energized electrical power sources.

In particular, the instant invention permits waveform analysis of isolated events of electrical noise of the system under test. A high-speed magnetic tape recorder stores the output signal of the system under test. A high-speed AC-to-DC converter receives the system output noise signal and inputs it to a fast-responding, track-and-hold peak detector. The output signal level of the peak detector may be displayed for any desired time interval limited by the droop (voltage decay of output with time) of the track-and-hold peak detector and reset for another display resulting in a set of discrete time interval printouts of peak system noise. Noise levels of interest may be rapidly located and a specific time display of the system output signal obtained from the magnetic tape recorder allowing detailed waveform analysis.

A primary object of invention is to provide an apparatus and method for testing and evaluating the characteristics of an energized electrical power source.

Another object of invention is to provide an apparatus and method for evaluating noise signals present on the outputs of reserve energizers used in fuses for gun ammunition.

A further object of invention is to provide an apparatus and method permitting waveform analysis on the output signal of any electrical device.

Still another object of invention is to provide a means for rapid location and detailed analysis of infrequently occurring electrical signal events of interest without requiring extensive real-time signal monitoring.

BRIEF DESCRIPTION OF THE DRAWINGS

FIG. 1 shows a functional block diagram of the instant invention.

FIG. 2 shows an expanded functional block diagram of the adaptor unit used in testing reserve energizers.

FIG. 3 shows functional flow of cell and noise voltages within the test analysis instrumentation.

FIG. 4 shows an expanded functional diagram of the noise detector of FIG. 3.

FIG. 5 shows a representative output signal from the noise detector.

DESCRIPTION OF THE PREFERRED EMBODIMENT

Referring to FIG. 1, an electrical power source to be tested is placed in a unit under test adaptor 1 which transmits electrical output signals of the unit under test to the test analysis instrumentation 3 and the high-speed magnetic tape recorder 5. Signals of the unit under test are then analyzed over discrete time intervals by the test analysis instrumentation and the data values derived for each time interval transmitted to a recording digital display device 7. A reproduction of the electrical output signals for time intervals of interest may be recalled from the tape recorder 5 and transmitted to waveform analysis equipment 9 for detailed analysis. Identification of time intervals of interest is based upon the data values derived for each of the time intervals.

In FIG. 2 is shown an expanded functional diagram view of the unit under test adaptor 1. This particular diagram is an embodiment unique to the testing of reserve energizers for electrically fused gun ammunition. Typically, the reserve energizers are inactive batteries separated from an activating electrolyte by a frangible barrier. Breaking the barrier activates the reserve energizer. Other obvious configurations testing any electrical power source and resulting in parallel outputs of cell DC voltages and noise voltages will work equally well in the instant invention. From the control panel 11, the power control 13 is activated to turn a motor driven spindle 15 engaging the unit under test holder 17 which holds the unit under test while simulating conditions under which the unit under test is normally activated. Spindle speed is sensed by a magnetic speed sensor 19 and relayed to the control panel 11. Once the proper rotational speed is achieved, the breaker gun 21 is activated from the control panel 11 resulting in breaking of the frangible barrier, subsequent activation of the unit under test and generation of signals from the unit under test in the unit under test holder 17 which are transmitted by a slip ring assembly 23 to a load box 25. The load box 25 is a hard-wired replaceable modular unit which separates AC cell noise from the DC cell output and provides the desired electrical load impedances for the outputs of the unit under test. DC cell voltages and noise voltages from the unit under test are transmitted directly to the test-analysis instrumentation set 3 and the high-speed magnetic tape recorder 5. Control signals from the control panel 11 are also sent to the test analysis instrumentation set 3 such that test system signal levels of interest are transmitted for display to the recording digital display device 7.

In FIG. 3 is shown an expanded functional block diagram of the test analysis instrumentation set 3. Noise voltages from the load box 25 are transmitted to amplifiers 27 having outputs to noise detectors 29 which have outputs to an analog switching circuit 31. The function of the analog switching circuit 31 is to switch between data recording channels. That is, noise and cell voltage from cell 1 can be recorded in channel 1 until switching circuit 31 switches to channel 2 for recording noise and cell voltage for cell 2 and so on. Channel switching commands are received from the digital data multiplexing and system control circuit 37 based upon the recording time interval desired. At the same time, DC cell voltages from the load box 25 are transmitted to DC-amp pre-scaling circuits 33 having outputs to both the analog switching circuit 31 and activation time measurement circuits included in a system test and control interface circuit 35. The pre-scaling circuits 33 adjust the level of the DC cell voltages such that the signal handling ability of the analog switching circuit is maximized. The activation time measurement circuits determine reserve energizer activation times using standard techniques. The system test and control interface circuit 35 outputs a signal to a digital multiplexing and system control circuit 37 having an output to the recording digital display device 7. The analog switching circuit has two outputs. One output is connected to the input of a DC cell voltage A/D converter 39 having output to digital multiplexing circuit 37. The other output is connected to a noise voltage A/D converter 41 also having output to digital multiplexing circuit 37. Analog channel switching control and reset signals for the analog switching circuit 31 and noise detectors 29 are provided by the digital multiplexing circuit 37.

In FIG. 4 is shown an expanded block diagram of the noise detectors 29. A fast-responding AC-to-DC converter 43 receives the output from the amplifiers 27 and outputs a signal to a peak detector 45 which is fast-responding, has track-and-hold capability and is resettable. In FIG. 5 is shown a typical output signal of the peak detector.

Peak detector 45 output at the end of each time interval is displayed on the recording digital display device 7 and is the criteria for determining the time interval for which detailed waveform analysis is required. The peak level shown in FIG. 5 represents the peak level of AC noise generated by the unit under test over the time interval under study. After display of the peak voltage level, the peak detector is reset and determines the peak noise for the succeeding time interval.

The instant invention therefore permits an operator performing tests of electrical power sources in which isolated noise events occur to rapidly locate and evaluate those events. It further stores and provides recall of sufficient data to perform extensive waveform analysis at a later time on those noise events if required.

In operation, the peak noise value and a sampled DC cell output level will be displayed digitally at the end of each time interval. If a noise event occurs during any of the time intervals, the peak noise value displayed for that time interval will be higher than other time intervals in which noise events do not occur. A time interval for which a noise event of interest occurs may be identified by the higher peak noise level, and may then be located and replayed from the high-speed magnetic tape recorder at normal or reduced speed permitting full waveform analysis of the noise event.

What is claimed is:

1. An analog/digital system for detection, measurement and evaluation of the characteristics of the output signal and the sporadically occurring noise signal of each cell of an energized electrical power source having at least one cell comprising:

(a) means for holding said electrical power source, said holding means having the capability to duplicate the conditions under which said electrical power source is to be energized;

(b) means for energizing said electrical power source, said energizing means cooperatively connected to said holding means and selectively activated when said conditions under which said electrical power source is to be used are achieved, each of said cells of said electrical power source outputting both a DC voltage and a superimposed AC noise voltage when energized;

(c) means for separately determining said DC voltage and the maximum level of said AC noise voltage output by each of said cells over discrete selectively variable time intervals, said determining means receiving as inputs said DC voltage and superimposed AC noise voltage outputs of each of said cells and transmitting as digital outputs the test characteristics of interest of said DC voltage and said maximum level of said AC noise voltage for each of said time intervals from each of said cells selectively;

(d) means for displaying hard copy real-time digital values of said test characteristics of interest occurring in said output signal of each of said cells for each of said time intervals, said displaying means receiving as inputs said digital outputs transmitted from said determining means and providing the capability for selective recall at a later time said digital values of said test characteristics of interest;

(e) means for storing for long terms said DC and said AC noise voltage output of each of said cells, said storing means having plural inputs and outputs and receiving as inputs said DC and said AC noise voltage output of each of said cells, said storing means having capability for providing as outputs reproductions of selected portions of said DC and said AC noise voltages for any of said discrete time intervals for which said real-time digital values of said test characteristics of interest have been measured; and (f) means for performing waveform analysis on said selected portions of said reproductions of said output signals of said cells corresponding to said output signals of said cells occurring in real time, said waveform analysis being selectively performed only on said reproductions corresponding to certain of said discrete time intervals for which said test characteristics of interest indicate the existence of said sporadically occurring noise signals, said existence indicated by display of a high maximum level of said AC noise voltage for said discrete time interval during which said noise signal occurred, said waveform analysis of all said AC noise signals occurring in said output signals of said cells being said evaluation of said characteristics of said noise signal.

2. An analog/digital system as recited in claim 1 wherein said performing means includes a strip-chart recorder.

3. An analog/digital system as recited in claim 1 wherein said displaying means includes a digital printer.

4. An analog/digital system as recited in claim 1 wherein said displaying means includes the memory of a digital computer.

5. An analog/digital system as recited in claim 1 wherein said holding means includes:
(a) a variable, high-speed spindle; and
(b) an adaptor configured to hold said electrical power source to be energized, said adaptor cooperatively engaged to said spindle.

6. An analog/digital system as recited in claim 1 wherein said determining means includes:
(a) an amplifier receiving as inputs said DC and superimposed AC noise voltage outputs of each of said cells and having an output;
(b) a pre-scaling circuit receiving as input said output of said amplifier and having plural outputs;
(c) an AC-to-DC converter receiving as input said output of said pre-scaling circuit;
(d) a fast-responding, resettable track-and-hold peak detector receiving as input the output of said converter and having an output; and
(e) means for converting analog signals to digital signals receiving as inputs said outputs of said pre-scaling circuit and said peak detector.

* * * * *